(12) United States Patent
Hin et al.

(10) Patent No.: US 11,652,134 B2
(45) Date of Patent: May 16, 2023

(54) MONOLITHIC SEGMENTED LED ARRAY ARCHITECTURE

(71) Applicant: LUMILEDS LLC, San Jose, CA (US)

(72) Inventors: Tze Yang Hin, Cupertino, CA (US);
Yu-Chen Shen, Sunnyvale, CA (US);
Luke Gordon, Santa Barbara, CA (US);
Danielle Russell Chamberlin, Belmont, CA (US); Daniel Bernardo Roitman, Menlo Park, CA (US)

(73) Assignee: Lumileds LLC, San Jose, CA (US)

( * ) Notice: Subject to any disclaimer, the term of this patent is extended or adjusted under 35 U.S.C. 154(b) by 0 days.

(21) Appl. No.: 17/832,460

(22) Filed: Jun. 3, 2022

(65) Prior Publication Data

US 2022/0293675 A1 Sep. 15, 2022

Related U.S. Application Data

(63) Continuation of application No. 16/226,604, filed on Dec. 19, 2018, now Pat. No. 11,355,548.
(Continued)

(30) Foreign Application Priority Data

Feb. 27, 2018 (EP) .................................... 18158961

(51) Int. Cl.
*H01L 27/15* (2006.01)
*H01L 33/60* (2010.01)
(Continued)

(52) U.S. Cl.
CPC ........ *H01L 27/156* (2013.01); *H01L 21/6836* (2013.01); *H01L 25/0753* (2013.01);
(Continued)

(58) Field of Classification Search
CPC ......... H01L 2221/68336; H01L 27/156; H01L 33/508; H01L 33/507; H01L 2933/0041; H10L 21/6836; H10L 33/005
See application file for complete search history.

(56) References Cited

U.S. PATENT DOCUMENTS

| 6,410,942 B1 | 6/2002 | Thibeault et al. |
| 9,978,727 B2 | 5/2018 | Takeya et al. |

(Continued)

FOREIGN PATENT DOCUMENTS

| JP | 2006032440 A | 2/2006 |
| JP | 2007109789 A | 4/2007 |

(Continued)

OTHER PUBLICATIONS

Extended European Search Report corresponding to EP18158961.5, dated Aug. 28, 2018, 7 pages.
(Continued)

*Primary Examiner* — Matthew C Landau
*Assistant Examiner* — Mark Hatzilambrou

(57) ABSTRACT

A first component with a first sidewall and a second component with a second sidewall may be mounted onto an expandable film such that an original distance X is the distance between the first sidewall and the second sidewall. The expandable film may be expanded such that an expanded distance Y is the distance between the first sidewall and the second sidewall and expanded distance Y is greater than original distance X. A first sidewall material may be applied within at least a part of a space between the first sidewall and the second sidewall. The expandable film may be expanded such that a contracted distance Z is the distance between the first sidewall and the second sidewall, and contracted distance Z is less than expanded distance Y.

20 Claims, 18 Drawing Sheets

Related U.S. Application Data

(60) Provisional application No. 62/608,516, filed on Dec. 20, 2017.

(51) Int. Cl.

| | | |
|---|---|---|
| *H01L 33/50* | (2010.01) | |
| *H01L 33/00* | (2010.01) | |
| *H01L 21/683* | (2006.01) | |
| *H01L 25/075* | (2006.01) | |
| *H01L 33/46* | (2010.01) | |
| *H01L 33/44* | (2010.01) | |

(52) U.S. Cl.
CPC .......... *H01L 33/005* (2013.01); *H01L 33/504* (2013.01); *H01L 33/508* (2013.01); *H01L 33/60* (2013.01); *H01L 33/0095* (2013.01); *H01L 33/44* (2013.01); *H01L 33/46* (2013.01); *H01L 2221/68336* (2013.01); *H01L 2221/68354* (2013.01); *H01L 2933/0025* (2013.01); *H01L 2933/0041* (2013.01)

(56) References Cited

U.S. PATENT DOCUMENTS

| | | |
|---|---|---|
| 9,997,688 B2 | 6/2018 | Takeya et al. |
| 10,050,026 B2 | 8/2018 | Takeya et al. |
| 11,355,548 B2 | 6/2022 | Hin et al. |
| 2010/0279437 A1 | 11/2010 | Neff et al. |
| 2015/0129918 A1 | 5/2015 | Ikegami et al. |
| 2015/0171287 A1 | 6/2015 | Matsumura et al. |
| 2015/0357256 A1 | 12/2015 | Suthiwongsunthom et al. |
| 2016/0079491 A1 | 3/2016 | Endo |
| 2016/0190400 A1 | 6/2016 | Jung et al. |
| 2016/0240735 A1 | 8/2016 | Moran et al. |
| 2016/0293805 A1 | 10/2016 | Choi |
| 2017/0062672 A1 | 3/2017 | Goeoetz et al. |
| 2017/0271398 A1 | 9/2017 | Oh |
| 2018/0074372 A1 | 3/2018 | Takeya et al. |
| 2018/0174519 A1 | 6/2018 | Kim et al. |
| 2018/0283642 A1 | 10/2018 | Liao et al. |
| 2018/0371315 A1 | 12/2018 | Hofmann et al. |

FOREIGN PATENT DOCUMENTS

| | | |
|---|---|---|
| JP | 2007266625 A | 10/2007 |
| WO | 2010/058646 A1 | 5/2010 |
| WO | 2013/175338 A1 | 11/2013 |
| WO | 2014/002784 A1 | 1/2014 |
| WO | 2017/057454 A1 | 4/2017 |
| WO | 2017/102708 A1 | 6/2017 |
| WO | 2018/091657 A1 | 5/2018 |

OTHER PUBLICATIONS

From the EPO as the ISA, Notification of Transmittal of the International Search Report and the Written Opinion of the ISA corresponding to PCT/US2018/066959, dated Mar. 14, 2019, 13 pages.

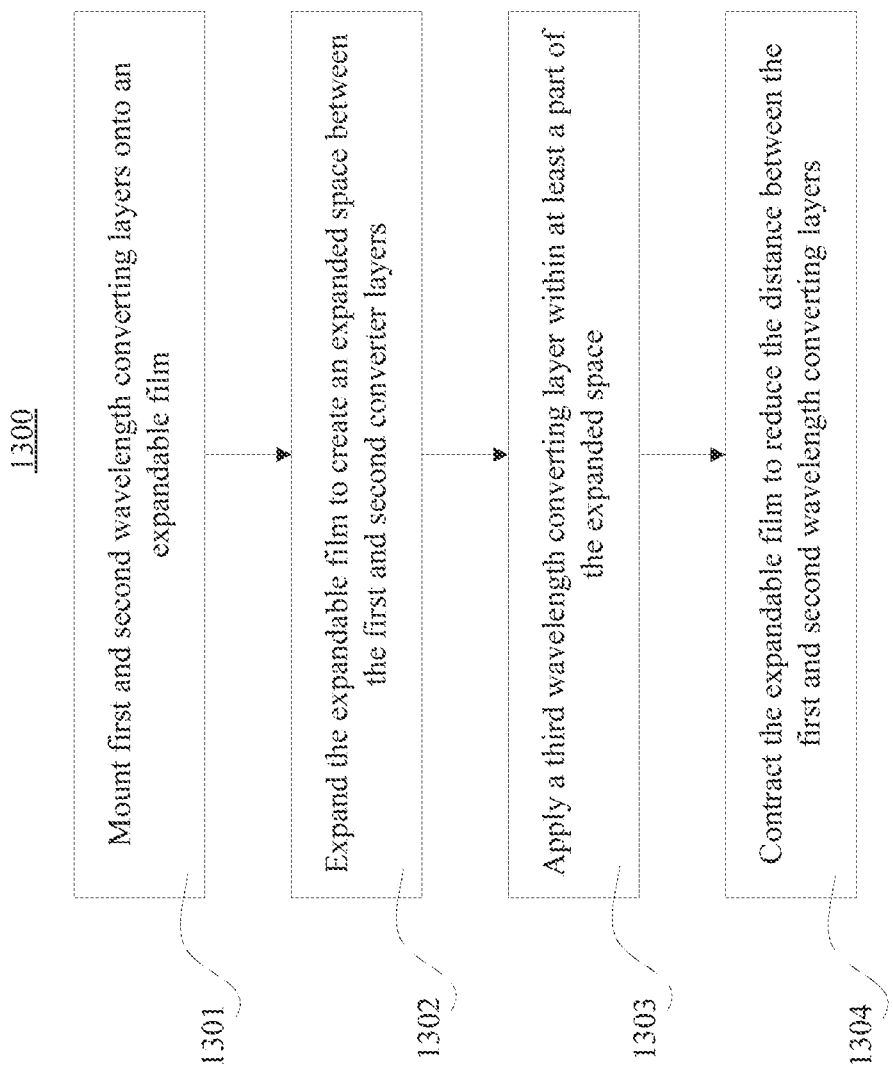

MONOLITHIC SEGMENTED LED ARRAY ARCHITECTURE

RELATED APPLICATIONS

This application is a continuation of U.S. application Ser. No. 16/226,604 filed Dec. 19, 2018 (now U.S. Pat. No. 11,355,548), which claims (i) benefit of U.S. Provisional Application No. 62/608,516 filed Dec. 20, 2017 and (ii) priority of Application No. EP 18158961.5 filed Feb. 27, 2018; each of those applications is incorporated by reference as if set forth herein in its entirety.

BACKGROUND

Precision control lighting applications can require the production and manufacturing of small addressable light emitting diode (LED) pixel systems. The smaller size of such pixel systems may require non-conventional components and manufacturing processes.

Semiconductor light-emitting devices including LEDs, resonant cavity light emitting diodes (RCLEDs), vertical cavity laser diodes (VCSELs), and edge emitting lasers are among the most efficient light sources available. Materials systems of interest in the manufacture of high-brightness light emitting devices capable of operation across the visible spectrum include Group III-V semiconductors, particularly binary, ternary, and quaternary alloys of gallium, aluminum, indium, and nitrogen, also referred to as III-nitride materials. III-nitride light emitting devices can be fabricated by epitaxially growing a stack of semiconductor layers of different compositions and dopant concentrations on a sapphire, silicon carbide, III-nitride, composite, or other suitable substrate by metal-organic chemical vapor deposition (MOCVD), molecular beam epitaxy (MBE), or other epitaxial techniques. The stack often includes one or more n-type layers doped with, for example, Si, formed over the substrate, one or more light emitting layers in an active region formed over the n-type layer or layers, and one or more p-type layers doped with, for example, Mg, formed over the active region. Electrical contacts are formed on the n- and p-type regions.

III-nitride devices are often formed as inverted or flip chip devices, where both the n- and p-contacts formed on the same side of the semiconductor structure, and most of the light is extracted from the side of the semiconductor structure opposite the contacts.

SUMMARY

In accordance with an aspect of the disclosed subject matter, a first component with a first sidewall and a second component with a second sidewall may be mounted onto an expandable film such that an original distance X is the distance between the first sidewall and the second sidewall. The expandable film can be expanded such that an expanded distance Y is the distance between the first sidewall and the second sidewall and expanded distance Y is greater than original distance X. A first sidewall material may be applied within at least a part of a space between the first sidewall and the second sidewall and the expandable film may be contracted such that a contracted distance Z is the distance between the first sidewall and the second sidewall, and contracted distance Z is less than expanded distance Y.

BRIEF DESCRIPTION OF THE DRAWINGS

A more detailed understanding may be had from the following description, given by way of example in conjunction with the accompanying drawings wherein:

FIG. 1D is a flowchart for mounting components, with sidewall material, onto closely configured layers;

FIG. 1F is a flowchart for mounting wavelength converting layers onto closely configured layers;

FIGS. 1I-1L are diagrams of sidewall material deposited between components;

DETAILED DESCRIPTION

Figure 1A:
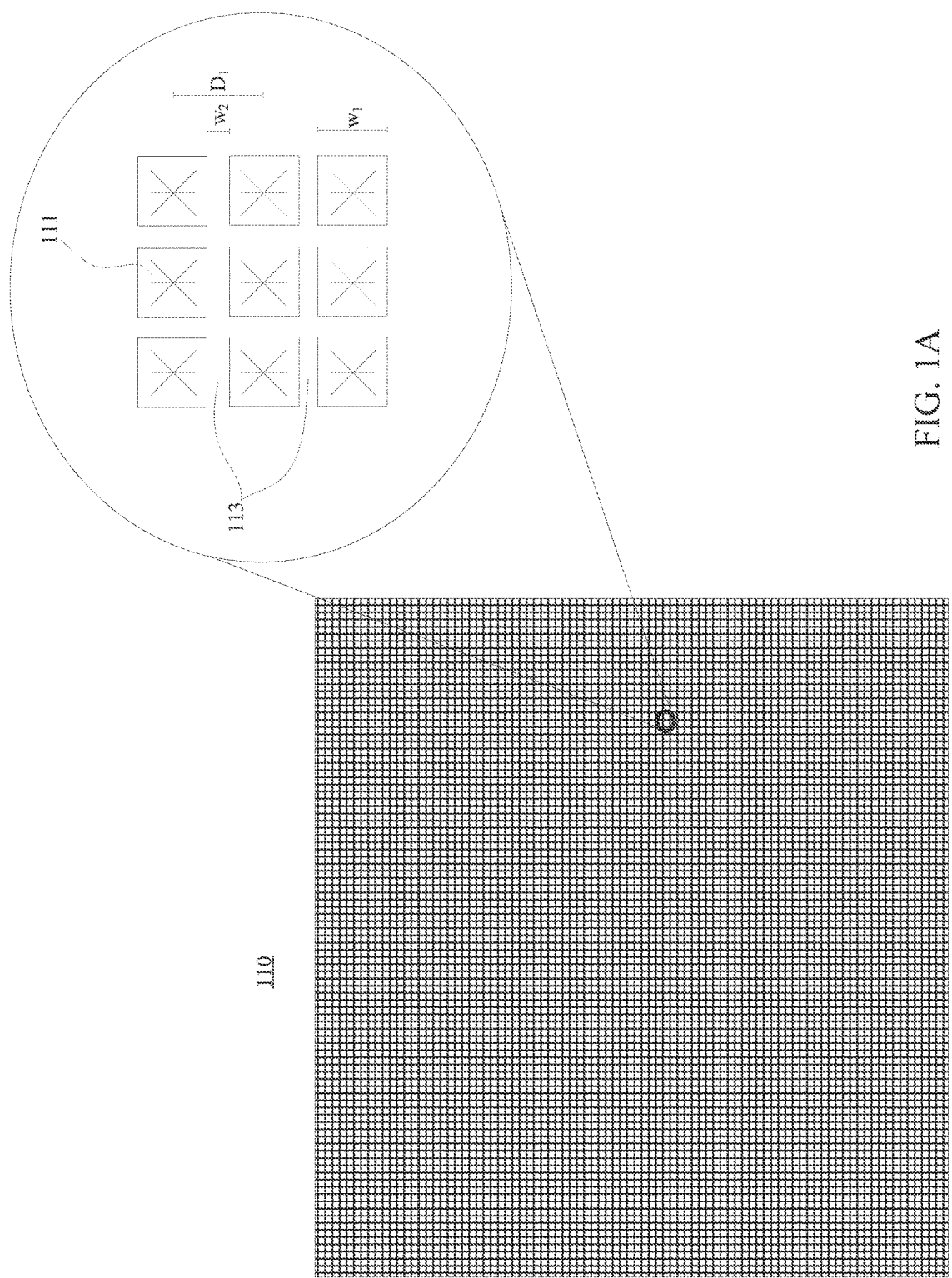
FIG. 1A is a top view illustration of a micro LED array with an exploded portion.

Examples of different light illumination systems and/or light emitting diode ("LED") implementations will be described more fully hereinafter with reference to the accompanying drawings. These examples are not mutually exclusive, and features found in one example may be combined with features found in one or more other examples to achieve additional implementations. Accordingly, it will be understood that the examples shown in the accompanying drawings are provided for illustrative purposes only and they are not intended to limit the disclosure in any way. Like numbers refer to like elements throughout.

It will be understood that, although the terms first, second, third, etc. may be used herein to describe various elements, these elements should not be limited by these terms. These terms may be used to distinguish one element from another. For example, a first element may be termed a second element and a second element may be termed a first element without departing from the scope of the present invention. As used herein, the term "and/or" may include any and all combinations of one or more of the associated listed items.

It will be understood that when an element such as a layer, region, or substrate is referred to as being "on" or extending "onto" another element, it may be directly on or extend directly onto the other element or intervening elements may also be present. In contrast, when an element is referred to as being "directly on" or extending "directly onto" another element, there may be no intervening elements present. It will also be understood that when an element is referred to as being "connected" or "coupled" to another element, it may be directly connected or coupled to the other element and/or connected or coupled to the other element via one or more intervening elements. In contrast, when an element is referred to as being "directly connected" or "directly coupled" to another element, there are no intervening elements present between the element and the other element. It will be understood that these terms are intended to encompass different orientations of the element in addition to any orientation depicted in the figures.

Relative terms such as "below," "above," "upper,", "lower," "horizontal" or "vertical" may be used herein to describe a relationship of one element, layer, or region to another element, layer, or region as illustrated in the figures. It will be understood that these terms are intended to encompass different orientations of the device in addition to the orientation depicted in the figures.

Semiconductor light emitting devices (LEDs) or optical power emitting devices, such as devices that emit ultraviolet (UV) or infrared (IR) optical power, are among the most efficient light sources currently available. These devices (hereinafter "LEDs"), may include light emitting diodes, resonant cavity light emitting diodes, vertical cavity laser diodes, edge emitting lasers, or the like. Due to their compact size and lower power requirements, for example, LEDs may be attractive candidates for many different applications. For example, they may be used as light sources (e.g., flash lights and camera flashes) for hand-held battery-powered devices, such as cameras and cell phones. They may also be used, for example, for automotive lighting, heads up display (HUD) lighting, horticultural lighting, street lighting, torch for video, general illumination (e.g., home, shop, office and studio lighting, theater/stage lighting and architectural lighting), augmented reality (AR) lighting, virtual reality (VR) lighting, as back lights for displays, and IR spectroscopy. A single LED may provide light that is less bright than an incandescent light source, and, therefore, multi-junction devices or arrays of LEDs (such as monolithic LED arrays, micro LED arrays, etc.) may be used for applications where more brightness is desired or required.

Figure 1B:
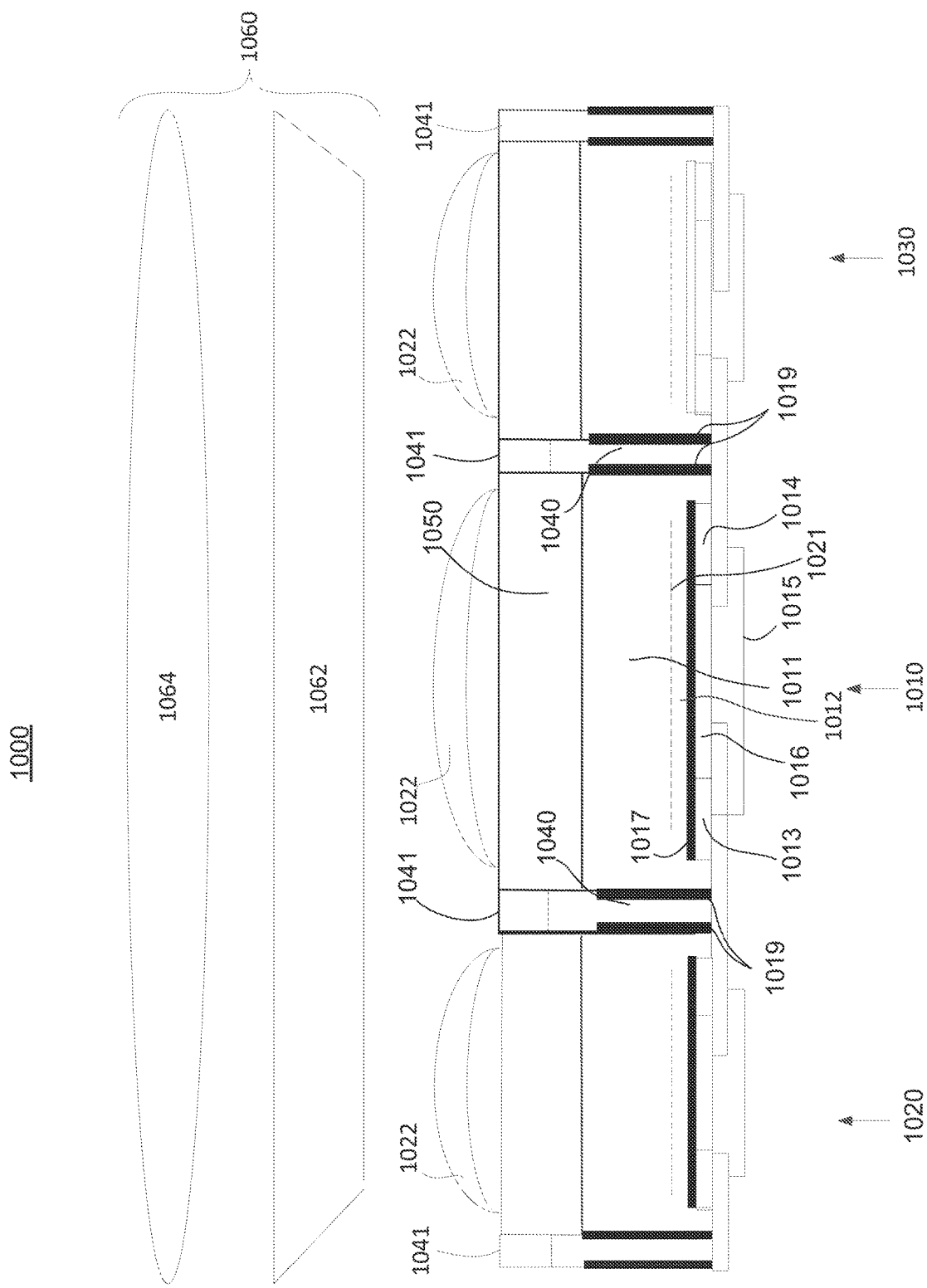
FIG. 1B is a cross sectional illustration of a pixel matrix with trenches.
Figure 1C:
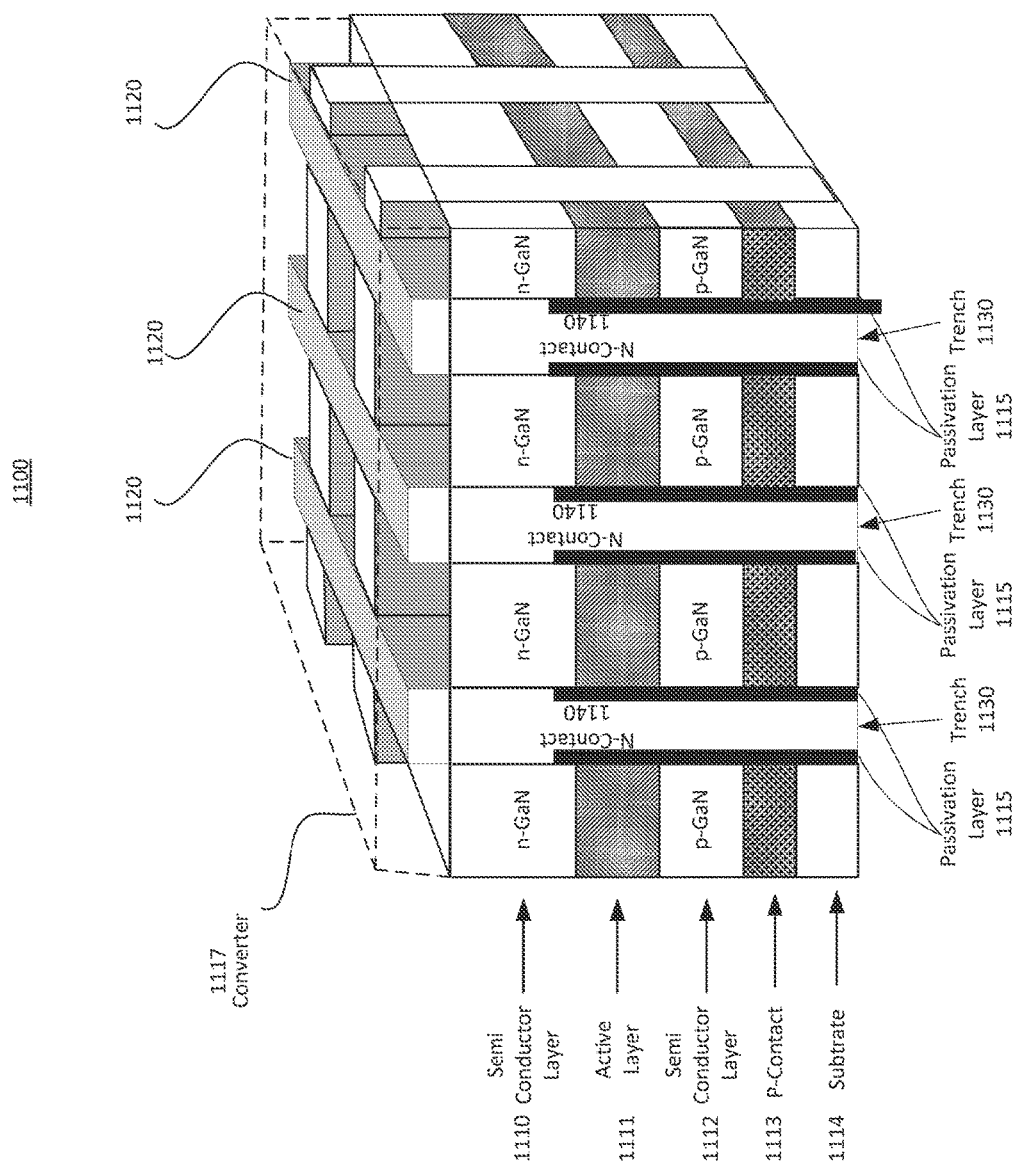
FIG. 1C is a perspective illustration of another pixel matrix with trenches.

According to embodiments of the disclosed subject matter, LED arrays (e.g., micro LED arrays) may include an array of pixels as shown in FIGS. 1A, 1B, and/or 1C. LED arrays may be used for any applications such as those requiring precision control of LED array segments. Pixels in an LED array may be individually addressable, may be addressable in groups/subsets, or may not be addressable. In FIG. 1A, a top view of a LED array 110 with pixels 111 is shown. An exploded view of a 3×3 portion of the LED array 110 is also shown in FIG. 1A. As shown in the 3×3 portion exploded view, LED array 110 may include pixels 111 with a width $w_1$ of approximately 100 µm or less (e.g., 40 µm). The lanes 113 between the pixels may be separated by a width, $w_2$, of approximately 20 µm or less (e.g., 5 µm). The lanes 113 may provide an air gap between pixels or may contain other material, as shown in FIGS. 1B and 1C and further disclosed herein. The distance $d_1$ from the center of one pixel 111 to the center of an adjacent pixel 111 may be approximately 120 µm or less (e.g., 45 µm). It will be understood that the widths and distances provided herein are examples only, and that actual widths and/or dimensions may vary.

It will be understood that although rectangular pixels arranged in a symmetric matrix are shown in FIGS. 1A, B and C, pixels of any shape and arrangement may be applied to the embodiments disclosed herein. For example, LED array 110 of FIG. 1A may include, over 10,000 pixels in any applicable arrangement such as a 100×100 matrix, a 200×50 matrix, a symmetric matrix, a non-symmetric matrix, or the like. It will also be understood that multiple sets of pixels, matrixes, and/or boards may be arranged in any applicable format to implement the embodiments disclosed herein.

FIG. 1B shows a cross section view of an example LED array 1000. As shown, the pixels 1010, 1020, and 1030 correspond to three different pixels within an LED array such that a separation sections 1041 and/or n-type contacts 1040 separate the pixels from each other. According to an embodiment, the space between pixels may be occupied by an air gap. As shown, pixel 1010 includes an epitaxial layer 1011 which may be grown on any applicable substrate such as, for example, a sapphire substrate, which may be removed from the epitaxial layer 1011. A surface of the growth layer distal from contact 1015 may be substantially planar or may be patterned. A p-type region 1012 may be located in proximity to a p-contact 1017. An active region 1021 may be disposed adjacent to the n-type region and a p-type region 1012. Alternatively, the active region 1021 may be between a semiconductor layer or n-type region and p-type region 1012 and may receive a current such that the active region 1021 emits light beams. The p-contact 1017 may be in contact with SiO2 layers 1013 and 1014 as well as metal layer 1016 (e.g., plated copper). The n type contacts 1040 may include an applicable metal such as Cu. The metal layer 1016 may be in contact with a contact 1015 which may be reflective.

Notably, as shown in FIG. 1B, the n-type contact 1040 may be deposited into trenches 1130 created between pixels 1010, 1020, and 1030 and may extend beyond the epitaxial layer. Separation sections 1041 may separate all (as shown) or part of a converter material 1050. It will be understood that a LED array may be implemented without such separation sections 1041 or the separation sections 1041 may correspond to an air gap. The separation sections 1041 may be an extension of the n-type contacts 1040, such that, separation sections 1041 are formed from the same material as the n-type contacts 1040 (e.g., copper). Alternatively, the separation sections 1041 may be formed from a material different than the n-type contacts 1040. According to an embodiment, separation sections 1041 may include reflective material. The material in separation sections 1041 and/or the n-type contact 1040 may be deposited in any applicable manner such as, for example, but applying a mesh structure which includes or allows the deposition of the n-type contact 1040 and/or separation sections 1041. Converter material 1050 may have features/properties similar to wavelength converting layer 205 of FIG. 2A. As noted herein, one or more additional layers may coat the separation sections 1041. Such a layer may be a reflective layer, a scattering layer, an absorptive layer, or any other applicable layer. One or more passivation layers 1019 may fully or partially separate the n-contact 1040 from the epitaxial layer 1011.

The epitaxial layer 1011 may be formed from any applicable material to emit photons when excited including sapphire, SiC, GaN, Silicone and may more specifically be formed from a III-V semiconductors including, but not limited to, AlN, AlP, AlAs, AlSb, GaN, GaP, GaAs, GaSb, InN, InP, InAs, InSb, II-VI semiconductors including, but not limited to, ZnS, ZnSe, CdSe, CdTe, group IV semiconductors including, but not limited to Ge, Si, SiC, and mixtures or alloys thereof. These example semiconductors may have indices of refraction ranging from about 2.4 to about 4.1 at the typical emission wavelengths of LEDs in which they are present. For example, III-Nitride semiconductors, such as GaN, may have refractive indices of about 2.4 at 500 nm, and III-Phosphide semiconductors, such as InGaP, may have refractive indices of about 3.7 at 600 nm. Contacts coupled to the LED device 200 may be formed from a solder, such as AuSn, AuGa, AuSi or SAC solders.

The n-type region may be grown on a growth substrate and may include one or more layers of semiconductor material that include different compositions and dopant concentrations including, for example, preparation layers, such as buffer or nucleation layers, and/or layers designed to facilitate removal of the growth substrate. These layers may be n-type or not intentionally doped, or may even be p-type device layers. The layers may be designed for particular optical, material, or electrical properties desirable for the light emitting region to efficiently emit light. Similarly, the p-type region 1012 may include multiple layers of different composition, thickness, and dopant concentrations, including layers that are not intentionally doped, or n-type layers. An electrical current may be caused to flow through the p-n junction (e.g., via contacts) and the pixels may generate light of a first wavelength determined at least in part by the bandgap energy of the materials. A pixel may directly emit light (e.g., regular or direct emission LED) or may emit light into a wavelength converting layer 1050 (e.g., phosphor converted LED, "PCLED", etc.) that acts to further modify wavelength of the emitted light to output a light of a second wavelength.

Although FIG. 1B shows an example LED array 1000 with pixels 1010, 1020, and 1030 in an example arrangement, it will be understood that pixels in an LED array may be provided in any one of a number of arrangements. For example, the pixels may be in a flip chip structure, a vertical injection thin film (VTF) structure, a multi-junction structure, a thin film flip chip (TFFC), lateral devices, etc. For example, a lateral LED pixel may be similar to a flip chip LED pixel but may not be flipped upside down for direct connection of the electrodes to a substrate or package. A TFFC may also be similar to a flip chip LED pixel but may have the growth substrate removed (leaving the thin film semiconductor layers un-supported). In contrast, the growth substrate or other substrate may be included as part of a flip chip LED.

The wavelength converting layer 1050 may be in the path of light emitted by active region 1021, such that the light emitted by active region 1021 may traverse through one or more intermediate layers (e.g., a photonic layer). According to embodiments, wavelength converting layer 1050 or may not be present in LED array 1000. The wavelength converting layer 1050 may include any luminescent material, such as, for example, phosphor particles in a transparent or translucent binder or matrix, or a ceramic phosphor element, which absorbs light of one wavelength and emits light of a different wavelength. The thickness of a wavelength converting layer 1050 may be determined based on the material used or application/wavelength for which the LED array 1000 or individual pixels 1010, 1020, and 1030 is/are arranged. For example, a wavelength converting layer 1050 may be approximately 20 µm, 50 µm or 200 µm. The wavelength converting layer 1050 may be provided on each individual pixel, as shown, or may be placed over an entire LED array 1000.

Primary optic 1022 may be on or over one or more pixels 1010, 1020, and/or 1030 and may allow light to pass from the active region 101 and/or the wavelength converting layer 1050 through the primary optic. Light via the primary optic may generally be emitted based on a Lambertian distribution pattern such that the luminous intensity of the light emitted via the primary optic 1022, when observed from an ideal diffuse radiator, is directly proportional to the cosine of the angle between the direction of the incident light and the surface normal. It will be understood that one or more properties of the primary optic 1022 may be modified to produce a light distribution pattern that is different than the Lambertian distribution pattern.

Secondary optics which include one or both of the lens 1065 and waveguide 1062 may be provided with pixels 1010, 1020, and/or 1030. It will be understood that although secondary optics are discussed in accordance with the example shown in FIG. 1B with multiple pixels, secondary optics may be provided for single pixels. Secondary optics may be used to spread the incoming light (diverging optics), or to gather incoming light into a collimated beam (collimating optics). The waveguide 1062 may be coated with a dielectric material, a metallization layer, or the like and may be provided to reflect or redirect incident light. In alternative embodiments, a lighting system may not include one or more of the following: the wavelength converting layer 1050, the primary optics 1022, the waveguide 1062 and the lens 1065.

Lens 1065 may be formed form any applicable transparent material such as, but not limited to SiC, aluminum oxide, diamond, or the like or a combination thereof. Lens 1065 may be used to modify the a beam of light to be input into the lens 1065 such that an output beam from the lens 1065 will efficiently meet a desired photometric specification. Additionally, lens 1065 may serve one or more aesthetic purpose, such as by determining a lit and/or unlit appearance of the multiple LED devices 200B.

FIG. 1C shows a cross section of a three dimensional view of a LED array 1100. As shown, pixels in the LED array 1100 may be separated by trenches which are filled to form n-contacts 1140. The pixels may be grown on a substrate 1114 and may include a p-contact 1113, a p-GaN semiconductor layer 1112, an active region 1111, and an n-Gan semiconductor layer 1110. It will be understood that this structure is provided as an example only and one or more semiconductor or other applicable layers may be added, removed, or partially added or removed to implement the disclosure provided herein. A converter material 1117 may be deposited on the semiconductor layer 1110 (or other applicable layer).

Passivation layers 1115 may be formed within the trenches 1130 and n-contacts 1140 (e.g., copper contacts) may be deposited within the trenches 1130, as shown. The passivation layers 1115 may separate at least a portion of the n-contacts 1140 from one or more layers of the semiconductor. According to an implementation, the n-contacts 1140, or other applicable material, within the trenches may extend into the converter material 1117 such that the n-contacts 1140, or other applicable material, provide complete or partial optical isolation between the pixels.

According to embodiments of the disclosed subject matter, an expandable film may be configured to expand the space between components (e.g., wavelength converting layers, dies, etc.) that are mounted onto the expandable tape, resulting in expanded lanes between the converter components. The expanded lanes may enable application of one or more sidewall material such as spacer material or optical isolation materials, or one or more additional components (e.g., one or more wavelength converting layers with the same or different properties as the wavelength converting layers already on the expandable film). A spacer material may be any applicable material configured to separate two or more components and may enable the separation to allow alignment with light emitting devices, as disclosed herein. Optical isolation material may be distributed Bragg reflector (DBR) layers, reflective material, absorptive material, or the like. The sidewall materials may be applied to one or more sidewalls of the components or may be deposited within the lanes such that they at least partially take the form of the expanded lanes. Alternatively or in addition, one or more components may be deposited within the lanes. The expandable film may then be contracted, resulting in the expanded lanes contracting to a smaller width. The components along with all or a part of the sidewall materials may then be mounted onto a light emitting device such as, but not limited to gallium nitride (GaN) mesas, LEDs, light active material, conductors, or the like.

It will be understood that although wavelength converting layers are specifically used in some examples of this disclosure, any applicable components (e.g., wavelength converting layer(s), semiconductor layer(s), die(s), substrate(s), etc.) may be applied to a film that can expand, in accordance with this disclosure.

Wavelength converting layers may contain, but are not limited to, one or more applicable luminescent or optically scattering material such as phosphor particles or other particles as previously disclosed herein.

FIG. 1D shows a flow chart 1200 with steps to apply sidewall material to sidewalls and/or within lanes of small addressable LED pixel systems.

Figure 1E:
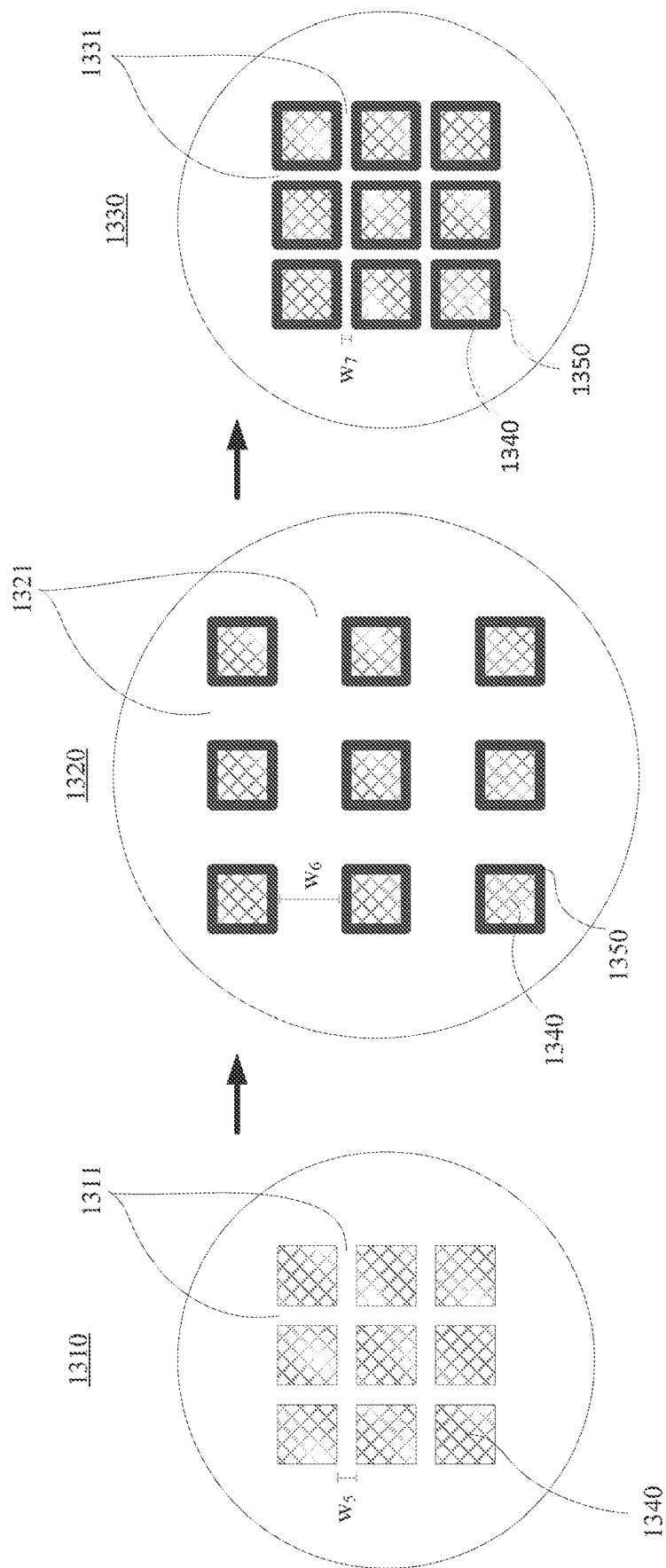
FIG. 1E is a top view diagram showing the stages of an expandable film.

According to an embodiment of the disclosed subject matter, at step 1201 of FIG. 1D, as also shown via a top view in FIG. 1E, a plurality of components 1340 may be mounted on an un-expanded expandable film 1310. For clarity, FIG. 1E shows the same expandable film in three different states. 1310 shows the expandable film in an un-expanded state, 1320 shows the expandable film in an expanded state and 1330 shows the expandable film after it has been expanded and contracted. As discussed below, the contracted expandable film 1330 may contract to the same size as the expandable film 1310 prior to being expanded or may contract to a different size.

The plurality of components 1340 may be mounted using any applicable technique such as bonding via adhesive, micro-connectors, or one or more physical connector. As an example, an adhesive may be applied using a spin-on process. The expandable film may be a blue tape, a white tape, a UV tape, or any other suitable material that allows mounting to a flexible/expandable film. The distance $w_5$ between the lanes 1311 created between components 1340 may be small, such as approximately 50 μm. In an embodiment, the distance of lanes 1311 may be 20 μm.

At step 1202 of FIG. 1D, as also shown in FIG. 1E the expandable film 1310 may be expanded as shown by expandable film 1320. The expansion may be an isotropic expansion such that the un-expanded expandable film 1310 is expanded substantially linearly to the expanded state of the expandable film 1320. As a non limiting example, the expansion may be isotropic such that a 20 μm expansion in the left direction may result in the center of the film to shift 10 μm left and the expandable film overall to expand linearly by 20 μm. According to an embodiment of the disclosed subject matter, the expandable film may expand in a non-linear manner which may be pre-determined or detectible based on the resulting expanded film 1320. As an example, a non-linear expansion may be one that results in a greater amount of expansion towards the edges of the expandable film and a lower amount of expansion towards the center. As an alternate example, a non-linear expansion may be one that results in a greater amount of expansion where a mechanism that causes the expansion is located. A mechanism that causes the expansion may be, for example, via a heat source, a clamp, a pulling mechanism, or the like. As an example, the expandable film may be expanded via a thermochemical expansion which allows the film to expand based on gradually increasing the temperature with high control fidelity. The film may contract when the temperature is lowered.

As shown in FIG. 1E, the distance between the components 1340 that creates the lanes 1311 may increase from the original distance $w_5$ on the un-expanded expandable film 1310 to a larger distance $w_6$ for lanes 1321. The distance $w_6$ may be sufficient to apply sidewall material to the sidewalls of the components 1340, as discussed herein.

At step 1203 of FIG. 1D, as also shown in FIG. 1E, sidewall material 1350 may be applied within at least part of the expanded space between components 1340. The sidewall material may be any applicable spacer material or optical isolation material such as a distributed Bragg reflector (DBR) layer(s), reflective material, absorptive material, or the like. As specific examples, the sidewall material may include stainless steel or aluminum. DBR layers may include, but are not limited to, layers of $SiO_2$ and $TiO_2$; $SiO_2$ and $ZrO_2$; SiC and MgO; SiC and Silica; GaAs and AlAs; ITO; or a-Si and a-Si. The amount of space $w_6$ between the wavelength converting layers 340 may allow the application of the sidewall material 1350.

At step 1204 of FIG. 1D, as also shown in FIG. 1E, the expandable film may be contracted as shown by expandable film 1330. The contraction may result in an isotropic contraction such that the contracted film 1330 is contracted substantially linearly to the state of the contracted film 1330. As a non limiting example, the contraction may be isotropic such that a 20 μm contraction towards the center may result in both the left side and the right side of the film to contract by 10 μm towards the center and the expandable film overall to contract linearly. According to an embodiment of the disclosed subject matter, the expandable film may contract in a non-linear manner which may be pre-determined or detectible based on the resulting contracted film. As a non limiting example, a non-linear contraction may be one that results in a greater amount of contraction by the top edges of the expandable film and a lower amount of expand by the bottom edge of the expandable film. As an alternate example, a non-linear contraction may be one that results in a lower amount of contraction where a mechanism that caused the expansion is located.

It should be noted that the amount of space $w_5$ or $w_7$ between the components 1340 that creates the lanes 1311 on the un-expanded expandable film 1310 or the lanes 1331 in contracted expandable film 1330 may not allow an application of sidewall material, as disclosed herein. As a specific non limiting example in reference to FIG. 1E, $w_5$ may be 50 μm wide, $w_6$ may be 100 μm wide, and $w_7$ may be 20 μm wide. In this example, it should be noted that $w_7$ is less than $w_5$ (20 μm wide vs. 50 μm wide) as, in this example, $w_7$ is calculated as the width between the sidewall materials 1350 applied to the sidewalls of adjacent wavelength converting layers 1340.

An expandable film may be expanded to deposit one or more wavelength converting layers between wavelength converting layers placed on an unexpanded expandable film. The one or more wavelength converting layers to be placed may have the same properties (e.g., peak wavelength emission, phosphor particle type, dimension, etc.) as the wavelength converting layers placed on the unexpanded expandable film. Alternatively or in addition, the one or more wavelength converting layers to be placed may allow for color variation such that the one or more wavelength converting layers may have properties different than the wavelength converting layers placed on the unexpanded expandable film. FIG. 1F shows a flow chart 1300 with steps to apply one or more wavelength converting layers within lanes between originally placed wavelength converting layers, the lanes created by expanding the expandable film, as disclosed herein.

Figure 1G:
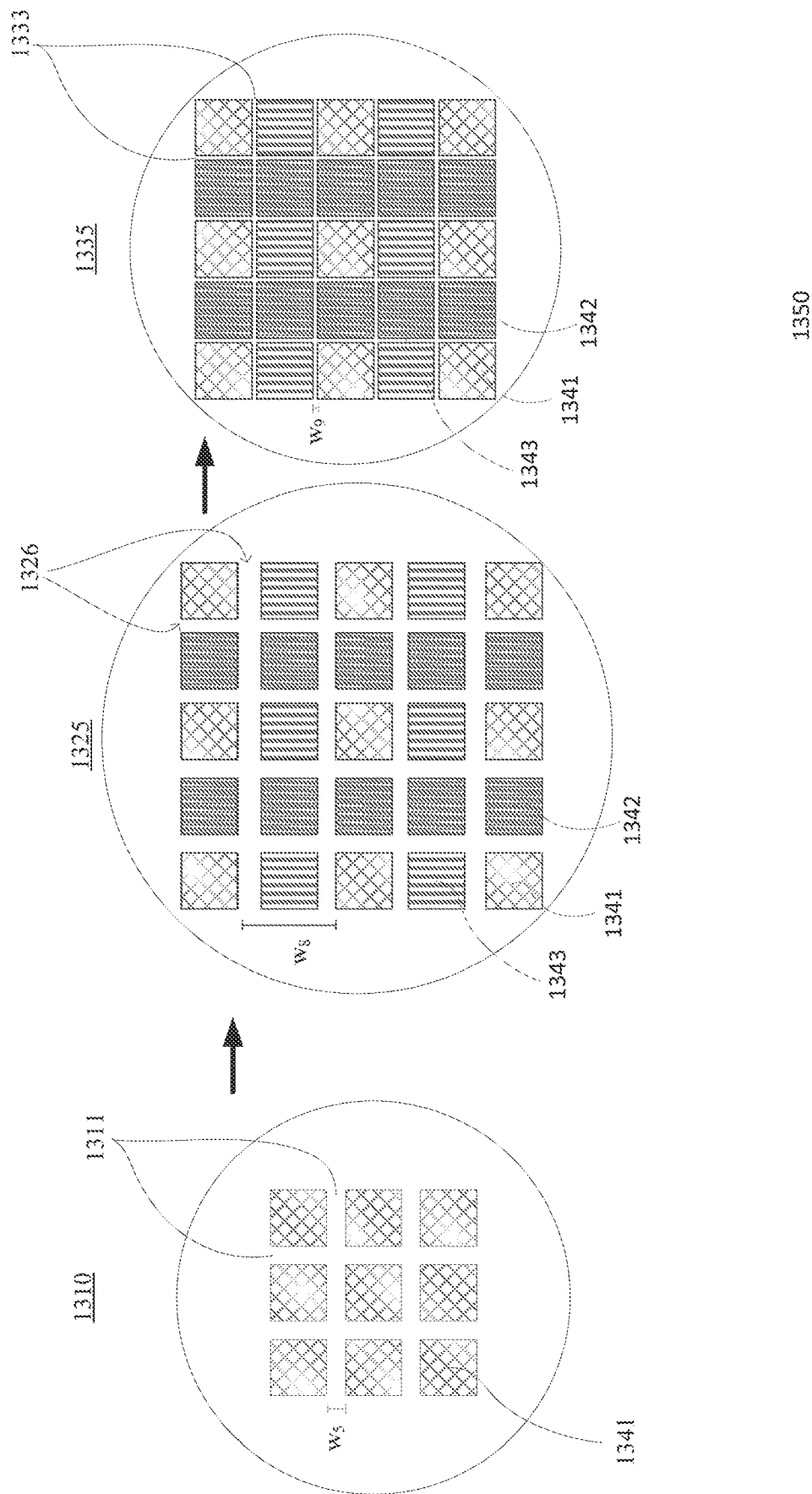
FIG. 1G is a top view diagram showing the stages of another expandable film.

According to an embodiment of the disclosed subject matter, at step 1301 of FIG. 1F, as also shown via a top view in FIG. 1G, a plurality of wavelength converting layers 1341 may be mounted on an un-expanded expandable film 1310. For clarity, FIG. 1F shows the same expandable film in three different states. 1310 shows the expandable film in an un-expanded state, 1325 shows the expandable film in an expanded state and 1335 shows the expandable film after it has been expanded and contracted. As discussed below, the contracted expandable film 1335 may contract to the same size as the expandable film 1310 prior to being expanded or may contract to a different size.

The plurality of wavelength converting layers 1341 may be mounted using any applicable technique such as bonding via adhesive, micro-connectors, or one or more physical connector. As an example, an adhesive may be applied using a spin-on process. The expandable film may be a blue tape, a white tape, a UV tape, or any other suitable material that allows mounting to a flexible/expandable film. The distance $w_5$ between the lanes 1311 created between wavelength converting layers 1341 may be small, such as approximately 50 µm. In an embodiment, the distance of lanes 1311 may be 20 µm.

At step 1302 of FIG. 1F, as also shown in FIG. 1G the expandable film 1310 may be expanded as shown by expandable film 1325. The expansion may be an isotropic expansion such that the un-expanded expandable film 1310 is expanded substantially linearly to the expanded state of the expandable film 1320. As a non limiting example, the expansion may be isotropic such that a 100 µm expansion in the left direction may result in the center of the film to shift 50 µm left and the expandable film overall to expand linearly by 100 µm. According to an embodiment of the disclosed subject matter, the expandable film may expand in a non-linear manner which may be pre-determined or detectible based on the resulting expanded film 1325. As an example, a non-linear expansion may be one that results in a greater amount of expansion towards the edges of the expandable film and a lower amount of expansion towards the center. As an alternate example, a non-linear expansion may be one that results in a greater amount of expansion where a mechanism that causes the expansion is located. A mechanism that causes the expansion may be, for example, via a heat source, a clamp, a pulling mechanism, or the like. As an example, the expandable film may be expanded via a thermochemical expansion which allows the film to expand based on gradually increasing the temperature with high control fidelity. The film may contract when the temperature is lowered.

As shown in FIG. 1G, the distance between the components 1340 that creates the lanes 1311 may increase from the original distance $w_5$ on the un-expanded expandable film 1310 to a larger distance $w_8$ for lanes 1326. The distance $w_8$ may be sufficient to apply one or more additional wavelength converting layers, as discussed herein.

At step 1303 of FIG. 1F, as also shown in FIG. 1G, one or more additional wavelength converting layers 1342 and 1343 may be applied within at least part of the expanded space between wavelength converting layers 1341. The additional wavelength converting layers may be the same as or similar to the wavelength converting layers 1341 or may be different than the wavelength converting layers 1341. According to an example, wavelength converting layers 1341 may be configured to emit a red peak wavelength, wavelength converting layers 1342 may be configured to emit a green peak wavelength, and wavelength converting layers 1343 may be configured to emit a blue peak wavelength.

According to an embodiment, the expandable film 1310 may be expanded in a first direction, such as horizontally in FIG. 1G, such that a first type of wavelength converting layers 1342 is deposited in the space created by the horizontal expansion. The expandable film may be expanded in a second direction, such as vertically in FIG. 1G, such that a second type of wavelength converting layer 1343 is deposited in the space created by the vertical expansion. The expansion in the first direction and in the second direction may occur at the same time or may occur in a sequence.

At step 1304 of FIG. 1F, as also shown in FIG. 1G, the expandable film may be contracted, as shown by expandable film 1335. The contraction may result in an isotropic contraction such that the contracted film 1335 is contracted substantially linearly to the state of the contracted film 1335. As a non limiting example, the contraction may be isotropic such that a 20 µm contraction towards the center may result in both the left side and the right side of the film to contract by 10 µm towards the center and the expandable film overall to contract linearly. According to an embodiment of the disclosed subject matter, the expandable film may contract in a non-linear manner which may be pre-determined or detectible based on the resulting contracted film. As a non limiting example, a non-linear contraction may be one that results in a greater amount of contraction by the top edges of the expandable film and a lower amount of expand by the bottom edge of the expandable film. As an alternate example, a non-linear contraction may be one that results in a lower amount of contraction where a mechanism that caused the expansion is located.

It should be noted that the amount of space $w_5$ or $w_9$ between the wavelength converting layers 1341 that creates the lanes 1311 on the un-expanded expandable film 1310 or the lanes 1333 in contracted expandable film 1335 may not allow an application of wavelength converting layers, as disclosed herein. As a specific non limiting example in reference to FIG. 1G, $w_5$ may be 50 µm wide, $w_8$ may be 140 µm wide, and $w_9$ may be 10 µm wide. In this example, it should be noted that $w_9$ is less than $w_5$ (10 µm wide vs. 50 µm wide).

Figure 1H:
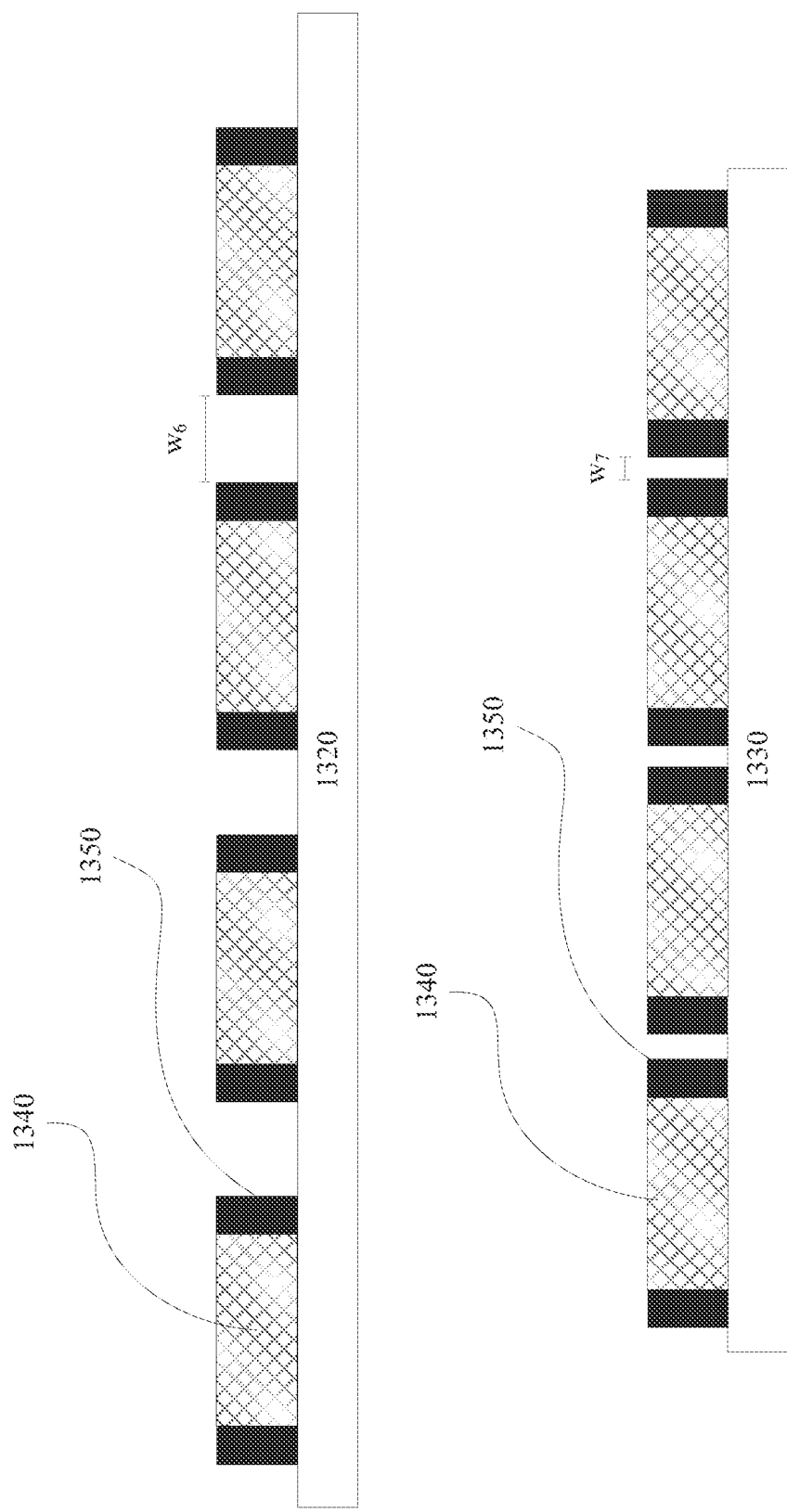
FIG. 1H is a cross sectional view diagram showing the stages of an expandable film.
Figure 11:
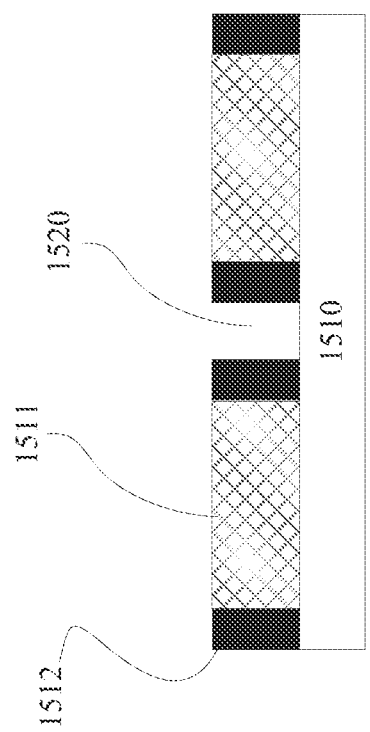

FIG. 1H shows a cross-sectional view of the expanded expandable film 1320 and the collapsed expandable film 1330. As shown in FIG. 1H, the expanded expandable film 1320 allows for a wide lane with a width of $w_6$. When collapsed, expandable film 1330 contracts such that the lane width between the wavelength converting layers 1340 with a sidewall material 1350 is reduced to $w_7$ which is less than the wider width $w_6$.

According to an embodiment disclosed herein, as show in FIG. 1I, mounting components 1511 onto an expandable film 1510, expanding the expandable film, applying sidewall materials 1512 to the sidewalls of the components 1511, and collapsing the expandable film 1510 may result in a narrow lane 1520 between two adjacent sidewall materials 1512. As a non-limiting example, such a narrow lane 1520 may be present if the sidewall materials 1512 are DBR layers applied to the sidewalls of the adjacent components 1511. The narrow lane may have a width such that it allows the spacing between the components 1511 to align components 1511 for mounting onto a light emitting device, as disclosed herein in step 1204 of FIG. 1D. Specifically, the width of the narrow lane may enable components 1511 to be positioned directly opposite their respective light emitting device so that a plurality of wavelength converting layers on an expandable film may be mounted onto a plurality of light emitting devices substantially simultaneously. A visual representation of this alignment is shown in FIG. 1N.

Figure 1J:
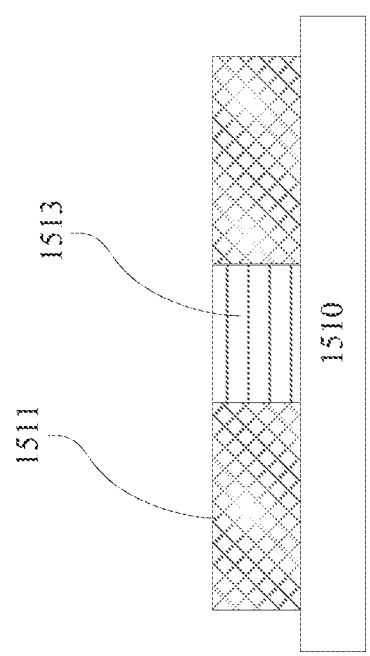

According to an embodiment disclosed herein, as show in FIG. 1J, mounting components 1511 onto an expandable film, expanding the expandable film, applying sidewall materials 1513 within the lanes created between adjacent components 1511, and collapsing the expandable film 1510 may result in a filled lane between two adjacent components 1511. As a non-limiting example, such a filled lane may be present if the sidewall material 1513 is an absorptive material or a reflective material. The absorptive or reflective material may be poured into the lanes while the expandable film is expanded, such that it assumes the form of the lanes either while the expandable film is expanded or when the expandable film is collapsed. The filled lane may have a width such that it allows the filled spacing between the components 1511 to align components 1511 for mounting onto a light emitting device. Specifically, the width of the filled lane may enable respective components 1511 to be positioned directly opposite their paired light emitting device so that a plurality of wavelength converting layers on an expandable film may be mounted onto a plurality of light emitting devices substantially simultaneously. A visual representation of this alignment is shown in FIG. 1N.

Figure 1K:
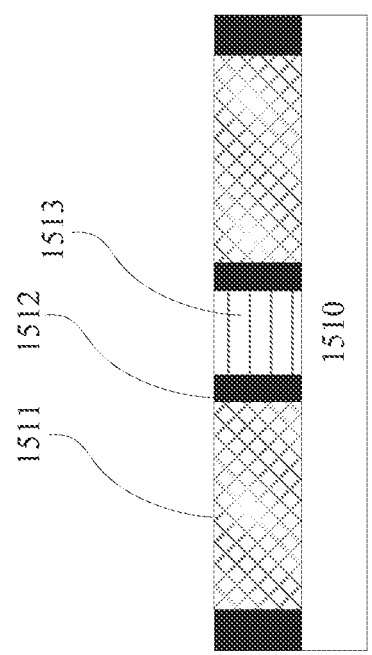

According to an embodiment disclosed herein, as show in FIG. 1K, mounting components 1511 onto an expandable film, expanding the expandable film, applying sidewall materials 1512 and 513 within the lanes created between adjacent wavelength converting layers 511, and collapsing the expandable film 510 may result in a filled lane between two adjacent sidewall materials 512. According to this embodiment, a first sidewall material 1512 may be applied to the sidewalls of adjacent wavelength converting layers and a second sidewall material 1513 may be poured into the lanes between adjacent sidewall materials 1512. Both the sidewall materials 1512 and 1513 may be applied while the expandable film is expanded. As a specific non limiting example, the sidewall material 1512 may be one or more DBR layers and may be applied directly to the sidewalls of adjacent components 1511. The sidewall material 1513 may be absorptive material or a reflective material. The absorptive or reflective material may be poured into the lanes while the expandable film is expanded, such that it assumes the form of the lanes either while the expandable film is expanded or when the expandable film is collapsed. The combined width of the sidewall materials 1512 and 1513 may allow the spacing between the components 1511 to align components 1511 for mounting onto a light emitting device. Specifically, the width of the sidewall materials 1512 and 1513 may enable respective components 1511 to be positioned directly opposite their paired light emitting device so that a plurality of wavelength converting layers on an expandable film may be mounted onto a plurality of light emitting devices substantially simultaneously. A visual representation of this alignment is shown in FIG. 1N.

Figure 1L:
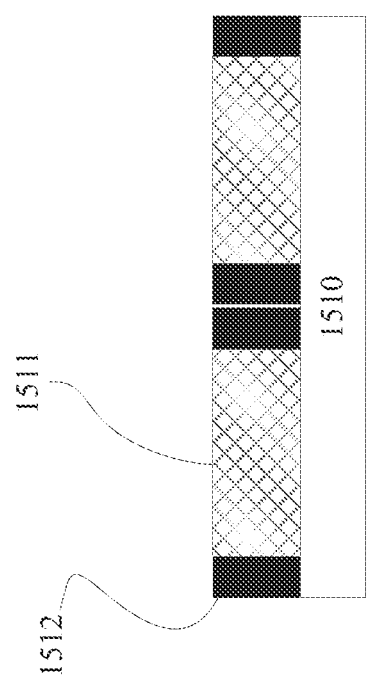
Figure 1M:
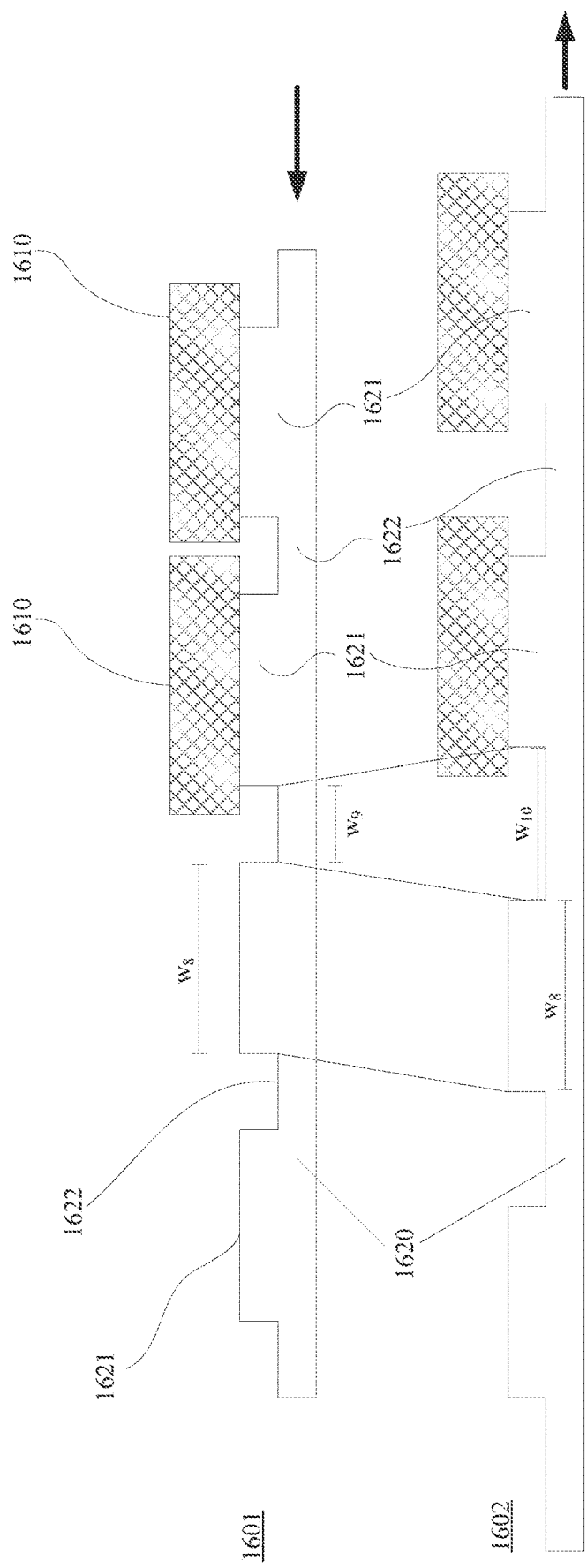
FIG. 1M is a diagram showing a thickness pattern on an expandable film.
Figure 1N:
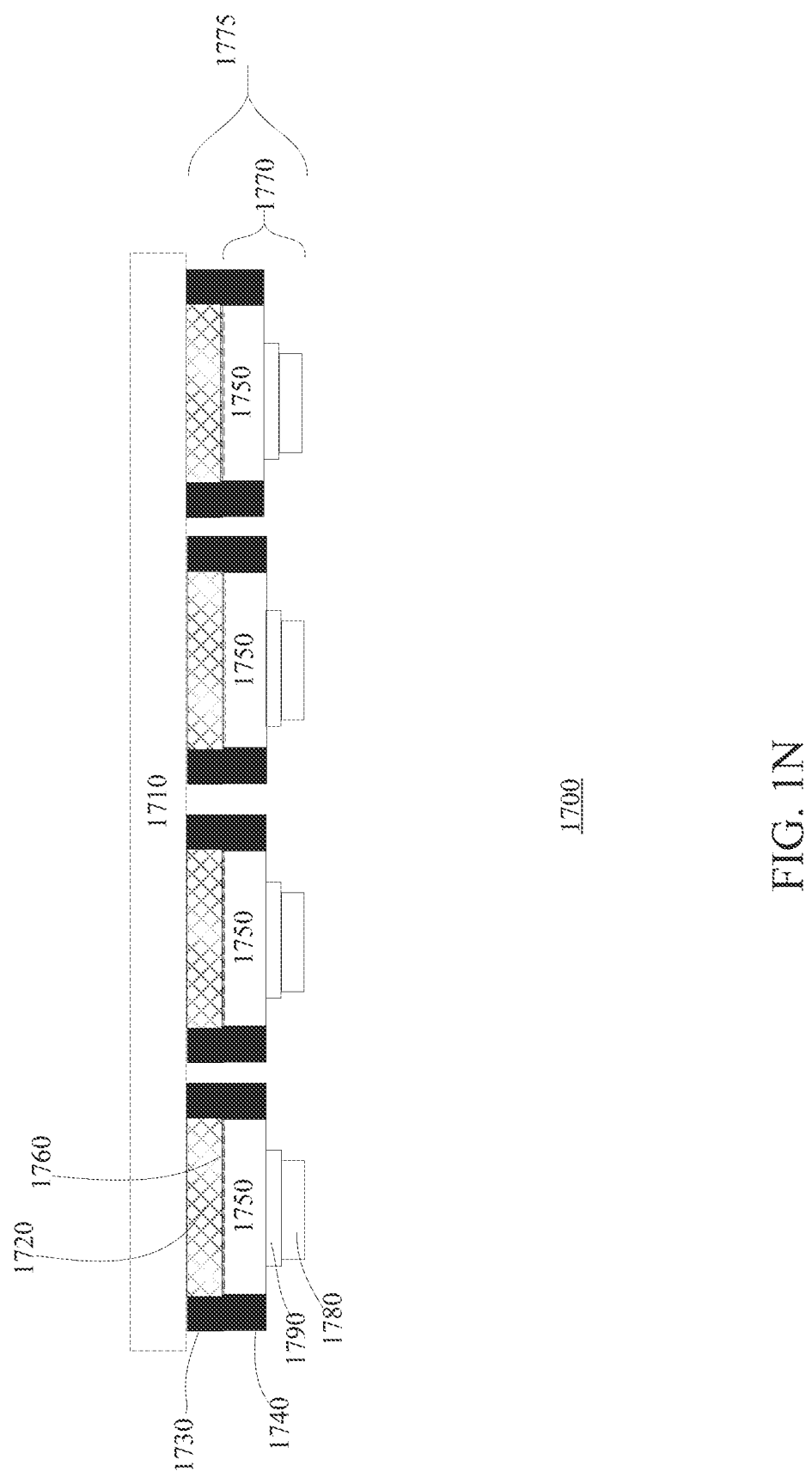
FIG. 1N is a diagram showing light emitter structures mounted onto a light emitting device.

According to an embodiment disclosed herein, as show in FIG. 1L, mounting components 1511 (e.g., wavelength converting layers) onto an expandable film, expanding the expandable film, applying sidewall materials 1512 to the sidewalls of the components 1511, and collapsing the expandable film 1510 may result in no space between adjacent sidewall materials 1512. As a non-limiting example, no space may be present if the sidewall materials 512 are DBR layers applied to the sidewalls of the adjacent components 1511. The adjacent sidewall materials 1512 may have a width such that the width allows the spacing between the components 1511 to align components 1511 for mounting onto a light emitting device. Specifically, the width of adjacent sidewall materials 1512 may enable respective components 1511 to be positioned directly opposite their paired light emitting device so that a plurality of wavelength converting layers on an expandable film may be mounted onto a plurality of light emitting devices substantially simultaneously. A visual representation of this alignment is shown in FIG. 1N.

According to an embodiment of the disclosed subject matter, an expandable film may expand or contract following an affine deformation. To reduce stress buildup on the expandable film, especially where wavelength converting layers are located, an expandable film thickness pattern may be implemented, as shown in FIG. 1M. An expandable film 1620 may contain varying levels of thickness such as thicker sections 1621 and thinner sections 1622. Wavelength converting layers 1610 may be mounted onto the thicker sections 1621 of the expandable film, as shown in the top block 1601, such that, when the expandable film is expanded or contracted, all or part of the added stress due to the mounted wavelength converting layers 1610 is compensated for and normalized, as a result of the added thickness of the thicker sections 1621.

The expanded expandable film is illustrated on the bottom block 1602 of FIG. 1M. As shown, the thicker sections 1621 may substantially maintain their width, $w_{11}$, as the expandable film changes from an un-expanded state to an expanded state. The thinner sections 1622 may experience a majority of the expanding and contracting, as shown by the difference in widths $w_9$ and $w_{10}$. As shown, w12 is smaller than $w_{12}$. Here, $w_{11}$ corresponds to the width of the thinner sections while the expandable film is un-expanded and $w_{12}$ corresponds to the width of the thinner sections when the expandable film is expanded. According to an embodiment, the thicker sections of an expandable film are at least twice as thick as the thinner sections of an expandable film.

According to an embodiment and as also shown in FIG. 1M, the surface area of the side of the wavelength converting layers 1610 that is in contact with the expandable film may be larger than the surface area of the thicker sections 1621 of the expandable film onto which the wavelength converting layers 1610 are mounted.

It will be understood that although square and/or rectangular patterns are described to represent the thicker and thinner portions of an expandable film, any applicable pattern that allows for a thicker section and a thinner section of an expandable film may be implemented. Such patterns can include, but are not limited to, circular features, elliptical features, crosses, non-symmetric features and the like.

According to an embodiment, a collapsible film is disclosed such that one or more components are placed on the collapsible film and, once placed, the film is collapsed to reduce the space between the components. According to this embodiment, sidewall material may be added before the collapsible film is collapsed such that once the collapsible film is collapsed, there may not be enough space between components to add sidewall material.

As shown in FIG. 1N, wavelength converting layers 1720 may be attached to light emitting devices 1770 of an LED array 1700, to create pixels 1775. In FIG. 1N, light emitting devices 1770 may include GaN layer 1750, active region 1790, one or more contacts 1780, pattern sapphire substrate (PSS) 1760, and wavelength converting layers 1720. The wavelength converting layers 1720 are shown on a contracted expandable film 1710, in accordance with the subject matter disclosed herein. The contracted expandable film 1710 may be contracted such that the distance between the wavelength converting layers 1720 enables the wavelength converting layers 1720 to align with the light emitting devices 1770 and to be attached to the light emitting devices 1770. More specifically, the spacing created between the wavelength converting layers 1720 during the expansion of the expandable film 1710, the application of a side layer material or additional wavelength converting layers 1720, and the contraction of the expandable film 1710 may allow the wavelength converting layers 1720 to be mounted onto the light emitting devices 1770.

As shown in FIG. 1N, sidewall materials 1730 may be applied to the wavelength converting layers 1720. The wavelength converting layers 1720 may be mounted over GaN layers 1750 and pattern sapphire substrate (PSS) patterns 1760 may be located between the GaN layers 1750 and the wavelength converting layers. Active regions 1790 may be configured to emit light at least partially towards the wavelength converting layers 1720 and the light emitting devices 1770 may include contacts 1780. Optical isolator material 1740 may be applied to the sidewalls of the GaN layer 1750. The expandable film 1710 may be removed from the wavelength converting layers 1720, for example, after the wavelength converting layers 1720 have been attached to the light emitting devices 1770.

As an example, the pixels 1775 of FIG. 1N may correspond to the pixels 111 of FIG. 1A-C. Specifically, as shown in FIG. 1A, the pixels 111 may correspond to the pixels 1775 of FIG. 1N after the wavelength converting layers 1720 are mounted onto the light emitting devices 1770. When the pixels 111 or 1775 are activated, the respective active regions 1790 of the emitters may generate a light. The light may pass through the wavelength converting layers 1720 and may substantially be emitted from the surface of the pixels 1775 (after the expandable film 1710 has been removed) and light that reaches the sidewalls of the wavelength converting layers 1720 may not escape from the sidewalls due to the sidewall materials 1730 and may be reflected when it intersects the sidewalls due to the sidewall materials 1730.

Figure 2A:
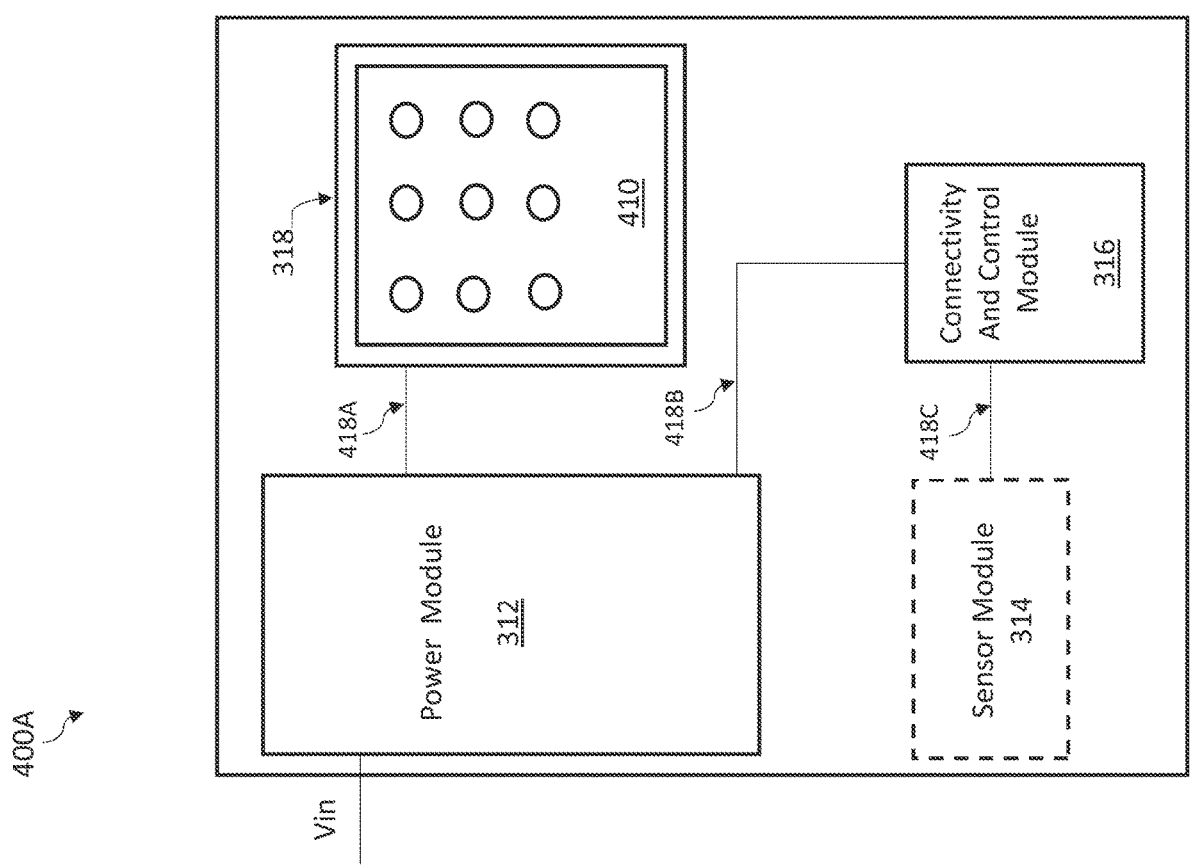
FIG. 2A is a top view of the electronics board with LED array attached to the substrate at the LED device attach region in one embodiment.

FIG. 2A is a top view of an electronics board with an LED array 410 attached to a substrate at the LED device attach region 318 in one embodiment. The electronics board together with the LED array 410 represents an LED system 400A. Additionally, the power module 312 receives a voltage input at Vin 497 and control signals from the connectivity and control module 316 over traces 418B, and provides drive signals to the LED array 410 over traces 418A. The LED array 410 is turned on and off via the drive signals from the power module 312. In the embodiment shown in FIG. 2A, the connectivity and control module 316 receives sensor signals from the sensor module 314 over trace 418C. The pixels 1775 of FIG. 1N may correspond to the in the pixels in the LED array 410 of FIG. 2A and may be manufactured in accordance with the techniques disclosed in FIGS. 1D-1M.

Figure 2B:
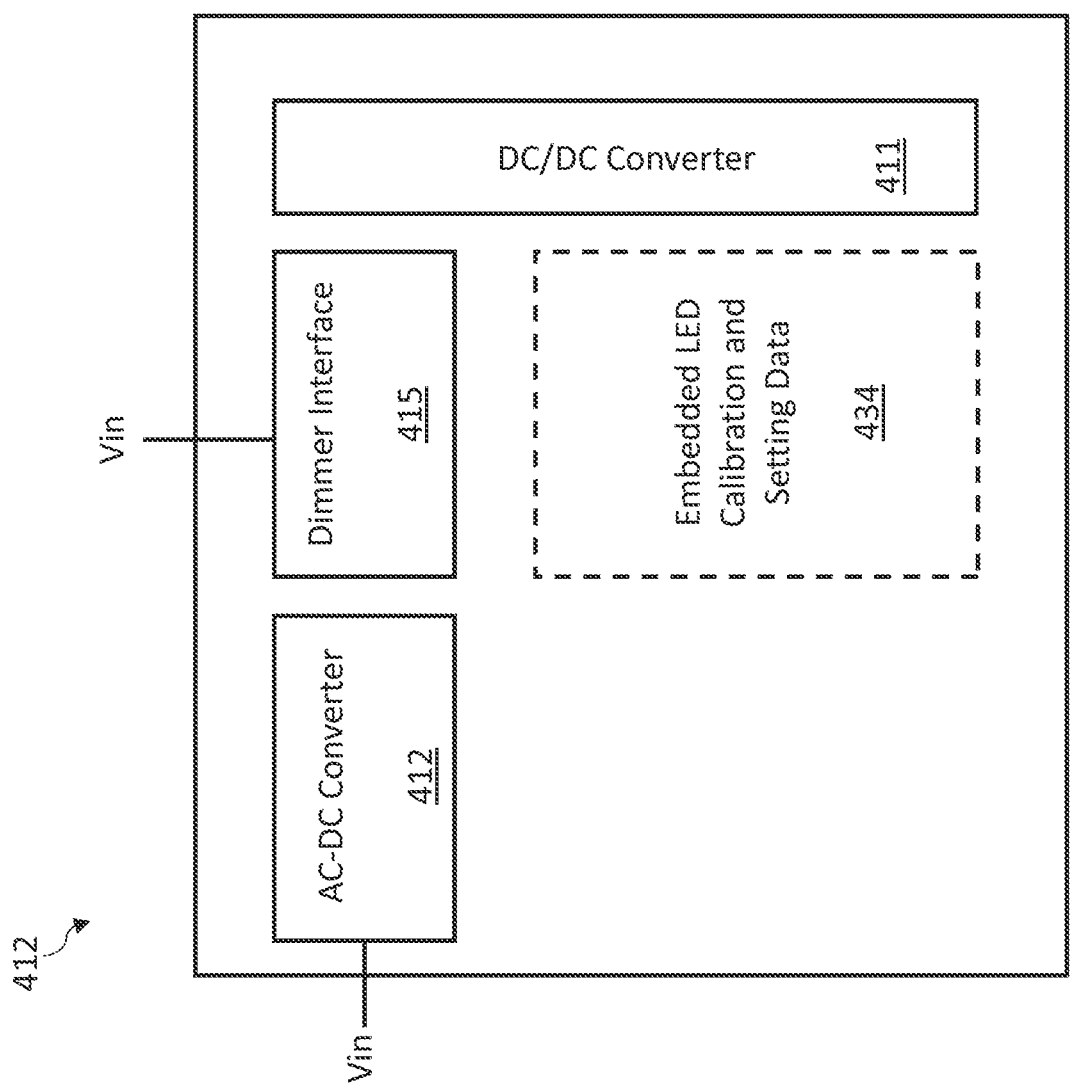
FIG. 2B is a diagram of one embodiment of a two channel integrated LED lighting system with electronic components mounted on two surfaces of a circuit board.

FIG. 2B illustrates one embodiment of a two channel integrated LED lighting system with electronic components mounted on two surfaces of a circuit board 499. As shown in FIG. 2B, an LED lighting system 400B includes a first surface 445A having inputs to receive dimmer signals and AC power signals and an AC/DC converter circuit 412 mounted on it. The LED system 400B includes a second surface 445B with the dimmer interface circuit 415, DC-DC converter circuits 440A and 440B, a connectivity and control module 416 (a wireless module in this example) having a microcontroller 472, and an LED array 410 mounted on it. The LED array 410 is driven by two independent channels 411A and 411B. In alternative embodiments, a single channel may be used to provide the drive signals to an LED array, or any number of multiple channels may be used to provide the drive signals to an LED array.

The LED array 410 may include two groups of LED devices. In an example embodiment, the LED devices of group A are electrically coupled to a first channel 411A and the LED devices of group B are electrically coupled to a second channel 411B. Each of the two DC-DC converters 440A and 440B may provide a respective drive current via single channels 411A and 411B, respectively, for driving a respective group of LEDs A and B in the LED array 410. The LEDs in one of the groups of LEDs may be configured to emit light having a different color point than the LEDs in the second group of LEDs. Control of the composite color point of light emitted by the LED array 410 may be tuned within a range by controlling the current and/or duty cycle applied by the individual DC/DC converter circuits 440A and 440B via a single channel 411A and 411B, respectively. Although the embodiment shown in FIG. 2B does not include a sensor module (as described in FIG. 2A), an alternative embodiment may include a sensor module.

The illustrated LED lighting system 400B is an integrated system in which the LED array 410 and the circuitry for operating the LED array 410 are provided on a single electronics board. Connections between modules on the same surface of the circuit board 499 may be electrically coupled for exchanging, for example, voltages, currents, and control signals between modules, by surface or sub-surface interconnections, such as traces 431, 432, 433, 434 and 435 or metallizations (not shown). Connections between modules on opposite surfaces of the circuit board 499 may be electrically coupled by through board interconnections, such as vias and metallizations (not shown).

According to embodiments, LED systems may be provided where an LED array is on a separate electronics board from the driver and control circuitry. According to other embodiments, a LED system may have the LED array together with some of the electronics on an electronics board separate from the driver circuit. For example, an LED system may include a power conversion module and an LED module located on a separate electronics board than the LED arrays.

According to embodiments, an LED system may include a multi-channel LED driver circuit. For example, an LED module may include embedded LED calibration and setting data and, for example, three groups of LEDs. One of ordinary skill in the art will recognize that any number of groups of LEDs may be used consistent with one or more applications. Individual LEDs within each group may be arranged in series or in parallel and the light having different color points may be provided. For example, warm white light may be provided by a first group of LEDs, a cool white light may be provided by a second group of LEDs, and a neutral white light may be provided by a third group.

Figure 2C:
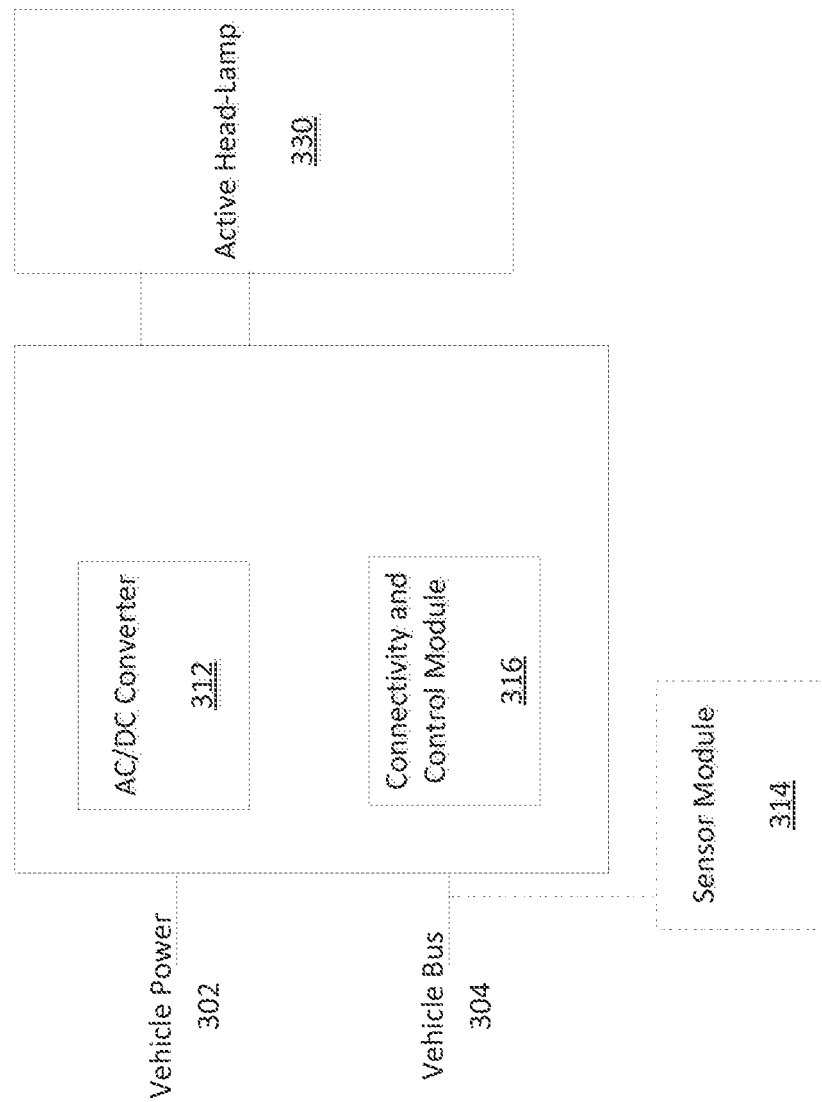
FIG. 2C is an example vehicle headlamp system.

FIG. 2C shows an example vehicle headlamp system 300 including a vehicle power 302 including a data bus 304. A sensor module 307 may be connected to the data bus 304 to provide data related to environment conditions (e.g. ambient light conditions, temperature, time, rain, fog, etc.), vehicle condition (parked, in-motion, speed, direction), presence/position of other vehicles, pedestrians, objects, or the like. The sensor module 307 may be similar to or the same as the sensor module 314 of FIG. 2A. AC/DC Converter 305 may be connected to the vehicle power 302. The pixels 1775 of FIG. 1N may correspond to the in the pixels in the active head lamp 330 of FIG. 2C and may be manufactured in accordance with the techniques disclosed in FIGS. 1D-1M.

The power module 312 (AC/DC converter) of FIG. 2C may be the same as or similar to the AC/DC converter 412 of FIG. 2B and may receive AC power from the vehicle power 302. It may convert the AC power to DC power as described in FIG. 2B for AC-DC converter 412. The vehicle head lamp system 300 may include an active head lamp 330 which receives one or more inputs provided by or based on the AC/DC converter 305, connectivity and control module 306, and/or sensor module 307. As an example, the sensor module 307 may detect the presence of a pedestrian such that the pedestrian is not well lit, which may reduce the likelihood that a driver sees the pedestrian. Based on such sensor input, the connectivity and control module 306 may output data to the active head lamp 330 using power provided from the AC/DC converter 305 such that the output data activates a subset of LEDs in an LED array contained within active head lamp 330. The subset of LEDs in the LED array, when activated, may emit light in the direction where the sensor module 307 sensed the presence of the pedestrian. These subset of LEDs may be deactivated or their light beam direction may otherwise be modified after the sensor module 207 provides updated data confirming that the pedestrian is no longer in a path of the vehicle that includes vehicle head lamp system.

Figure 3:
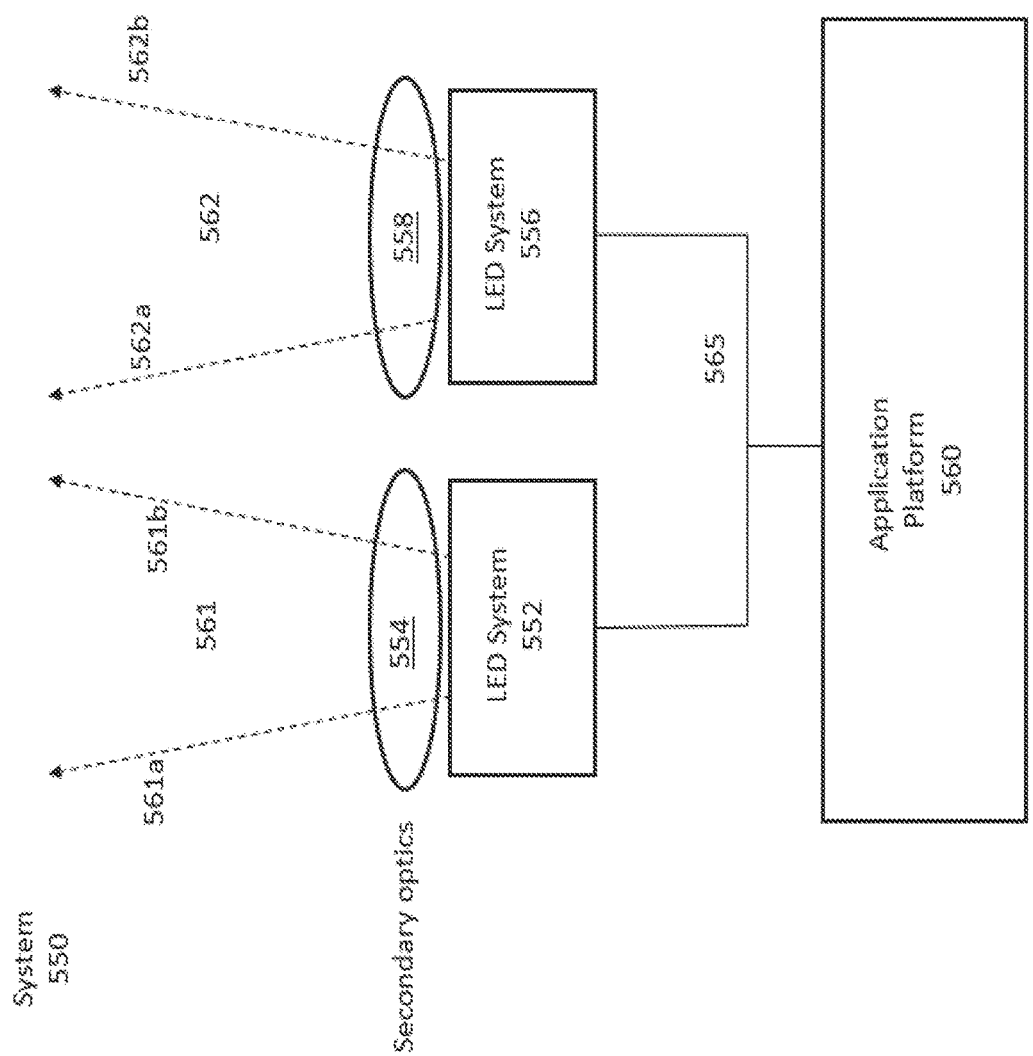
FIG. 3 shows an example illumination system.

FIG. 3 shows an example system 550 which includes an application platform 560, LED systems 552 and 556, and optics 554 and 558. LED system 552 and 556 may include LED arrays generated in accordance with the techniques disclosed in FIGS. 1D-M. The LED System 552 produces light beams 561 shown between arrows 561a and 561b. The LED System 556 may produce light beams 562 between arrows 562a and 562b. In the embodiment shown in FIG. 3, the light emitted from LED System 552 passes through secondary optics 554, and the light emitted from the LED System 556 passes through secondary optics 556. In alternative embodiments, the light beams 561 and 562 do not pass through any secondary optics. The secondary optics may be or may include one or more light guides. The one or more light guides may be edge lit or may have an interior opening that defines an interior edge of the light guide. LED systems 552 and/or 556 may be inserted in the interior openings of the one or more light guides such that they inject light into the interior edge (interior opening light guide) or exterior edge (edge lit light guide) of the one or more light guides. LEDs in LED systems 552 and/or 556 may be arranged around the circumference of a base that is part of the light guide. According to an implementation, the base may be thermally conductive. According to an implementation, the base may be coupled to a heat-dissipating element that is disposed over the light guide. The heat-dissipating element may be arranged to receive heat generated by the LEDs via the thermally conductive base and dissipate the received heat. The one or more light guides may allow light emitted by LED systems 552 and 556 to be shaped in a desired manner such as, for example, with a gradient, a chamfered distribution, a narrow distribution, a wide distribution, an angular distribution, or the like.

In example embodiments, the system 550 may be a mobile phone of a camera flash system, indoor residential or commercial lighting, outdoor light such as street lighting, an automobile, a medical device, AR/VR devices, and robotic devices. The LED System 400A shown in FIG. 2A and vehicle head lamp system 300 shown in FIG. 2C illustrate LED systems 552 and 556 in example embodiments.

The application platform 560 may provide power to the LED systems 552 and/or 556 via a power bus via line 565 or other applicable input, as discussed herein. Further, application platform 560 may provide input signals via line 565 for the operation of the LED system 552 and LED system 556, which input may be based on a user input/preference, a sensed reading, a pre-programmed or autonomously determined output, or the like. One or more sensors may be internal or external to the housing of the application platform 560. Alternatively or in addition, as shown in the LED system 400 of FIG. 2A, each LED System 552 and 556 may include its own sensor module, connectivity and control module, power module, and/or LED devices.

In embodiments, application platform 560 sensors and/or LED system 552 and/or 556 sensors may collect data such as visual data (e.g., LIDAR data, IR data, data collected via a camera, etc.), audio data, distance based data, movement data, environmental data, or the like or a combination thereof. The data may be related a physical item or entity such as an object, an individual, a vehicle, etc. For example, sensing equipment may collect object proximity data for an ADAS/AV based application, which may prioritize the detection and subsequent action based on the detection of a physical item or entity. The data may be collected based on emitting an optical signal by, for example, LED system 552 and/or 556, such as an IR signal and collecting data based on the emitted optical signal. The data may be collected by a different component than the component that emits the optical signal for the data collection. Continuing the example, sensing equipment may be located on an automobile and may emit a beam using a vertical-cavity surface-emitting laser (VCSEL). The one or more sensors may sense a response to the emitted beam or any other applicable input.

In example embodiment, application platform 560 may represent an automobile and LED system 552 and LED system 556 may represent automobile headlights. In various embodiments, the system 550 may represent an automobile with steerable light beams where LEDs may be selectively activated to provide steerable light. For example, an array of LEDs may be used to define or project a shape or pattern or illuminate only selected sections of a roadway. In an example embodiment, Infrared cameras or detector pixels within LED systems 552 and/or 556 may be sensors (e.g., similar to sensors module 314 of FIG. 2A and 307 of FIG. 2C) that identify portions of a scene (roadway, pedestrian crossing, etc.) that require illumination.

Having described the embodiments in detail, those skilled in the art will appreciate that, given the present description, modifications may be made to the embodiments described herein without departing from the spirit of the inventive concept. Therefore, it is not intended that the scope of the invention be limited to the specific embodiments illustrated and described. Although features and elements are described above in particular combinations, one of ordinary skill in the art will appreciate that each feature or element can be used alone or in any combination with the other features and elements. In addition, the methods described herein may be implemented in a computer program, software, or firmware incorporated in a computer-readable medium for execution by a computer or processor. Examples of computer-readable media include electronic signals (transmitted over wired or wireless connections) and computer-readable storage media. Examples of computer-readable storage media include, but are not limited to, a read only memory (ROM), a random access memory (RAM), a register, cache memory, semiconductor memory devices, magnetic media such as internal hard disks and removable disks, magneto-optical media, and optical media such as CD-ROM disks, and digital versatile disks (DVDs).

The invention claimed is:

1. A method for forming a light emitting device, the method comprising:
   providing a conversion array of multiple wavelength conversion structures mounted on a film that is expandable or contractable, each wavelength conversion structure comprising a bottom surface attached to the film, an oppositely positioned top surface, and sidewall surfaces connecting the top and bottom surfaces, the sidewall surfaces of each wavelength conversion structure mounted on the film being spaced apart from the sidewall surfaces of adjacent mounted wavelength conversion structures of the conversion array;
   applying a first sidewall material between each pair of adjacent sidewalls of the wavelength conversion structures of the conversion array;
   positioning a light emitting array, that includes multiple light emitting semiconductor diodes structures positioned on a common substrate, with the conversion structures and the diode structures between the film and the common substrate and with corresponding light emitting surfaces of the diode structures facing the top surfaces of corresponding wavelength conversion structures of the conversion array; and
   with the wavelength conversion structures remaining attached to the film and with the diode structures on the common substrate, attaching to the light emitting surface of each light emitting diode structure the top surface of a corresponding one of the wavelength conversion structures,
   and one or both of:
   before applying the first sidewall material, expanding the film to increase a gap distance between each pair of adjacent sidewalls of adjacent wavelength conversion structures of the conversion array; or
   after applying the first sidewall material, contracting the film to decrease the gap distance between each pair of adjacent sidewalls of adjacent wavelength conversion structures of the conversion array.

2. The method of claim 1, wherein each wavelength conversion structures comprises a ceramic phosphor element or a plurality of phosphor particles in a transparent or translucent binder or matrix.

3. The method of claim 1, wherein the expandable film comprises a plurality of thick sections and a plurality thin sections separating the thick sections from one another, with each thick section having a height that is at least two times a height of the thin sections, and with each wavelength conversion structure being mounted on a corresponding one of the thick sections.

4. The method of claim 3, wherein a surface area of the bottom of each wavelength conversion structure is larger than an area of the corresponding thick section to which that wavelength conversion structure is mounted.

5. The method of claim 1, wherein the first sidewall material includes one or both of an optical isolation material or a spacer material.

6. The method of claim 5, wherein the optical isolation material includes one or more of a light absorptive material or a light reflective material.

7. The method of claim 6, wherein the first sidewall material includes a first distributed Bragg reflector (DBR) layer applied to a first sidewall of each pair of adjacent sidewalls.

8. The method of claim 7, further comprising applying a second sidewall material between adjacent sidewalls of the wavelength conversion structures of the conversion array, the second sidewall material being applied between the first DBR layer and a second sidewall of each pair of adjacent sidewalls.

9. The method of claim 8, wherein the second sidewall material includes one or more of (i) a light absorptive material, (ii) a light reflective material, or (iii) a second distributed Bragg reflector (DBR) layer that is applied to the second sidewall of each pair of adjacent sidewalls.

10. The method of claim 8, wherein:
    the second sidewall material includes a second distributed Bragg reflector (DBR) layer that is applied to the second sidewall of each pair of adjacent sidewalls, and
    after attaching the wavelength conversion structures to the diode structures, the gap distance is equal to a sum of (i) the thickness of the DBR layer applied to the first sidewall of each pair of adjacent sidewalls and (ii) the thickness of the DBR layer applied to the second sidewall of each pair of adjacent sidewalls.

11. The method of claim 1, wherein the film is expanded before applying the first sidewall material.

12. The method of claim 11, wherein the diode structures are attached to the wavelength conversion structures after expanding the film.

13. The method of claim 1, wherein the film is contracted after applying the first sidewall material.

14. The method of claim 13, wherein the diode structures are attached to the wavelength conversion structures after contracting the film.

15. The method of claim 1, wherein the film is expanded before applying the first sidewall material and is contracted after applying the first sidewall material.

16. The method of claim 15, wherein the gap distance before expanding the film is equal to the gap distance after contracting the film.

17. The method of claim 1, wherein the diode structures are attached to the wavelength conversion structures without altering the gap distance.

18. The method of claim 1, wherein the film is configured to expand or contract in response to adjustments of temperature of the film.

19. The method of claim 1, wherein the film is configured to expand or contract either isotropically or nonlinearly.

20. The method of claim 1, wherein the film is a thermally-releasable tape or a UV-releasable tape.

* * * * *